United States Patent [19]
Devore et al.

[11] Patent Number: 6,144,070
[45] Date of Patent: Nov. 7, 2000

[54] HIGH BREAKDOWN-VOLTAGE TRANSISTOR WITH ELECTROSTATIC DISCHARGE PROTECTION

[75] Inventors: Joseph A. Devore, Richardson; Ross E. Teggatz, McKinney; David J. Baldwin, Allen, all of Tex.

[73] Assignee: Texas Instruments Incorporated, Dallas, Tex.

[21] Appl. No.: 09/141,496

[22] Filed: Aug. 28, 1998

Related U.S. Application Data

[60] Provisional application No. 60/057,217, Aug. 29, 1997.
[51] Int. Cl.[7] ........................... H01L 29/76; H01L 29/94; H01L 23/62; H01L 23/58
[52] U.S. Cl. ....................... 257/343; 257/409; 257/360; 257/361; 257/488; 257/492; 257/493
[58] Field of Search ................................ 257/343, 409, 257/360, 361, 488, 492, 493

[56] References Cited

U.S. PATENT DOCUMENTS 5,796,146  8/1998  Ludikhuize ............................ 257/343

FOREIGN PATENT DOCUMENTS 5-283622  10/1993  Japan ...................................... 257/343

*Primary Examiner*—Steven H. Loke
*Attorney, Agent, or Firm*—Carlton H. Hoel; W. James Brady; Frederick J. Telecky, Jr.

[57] ABSTRACT

A transistor including a source region 506 in a semiconductor body 502; a bulk region 508 in the semiconductor body adjacent the source region; a drain region in the semiconductor body adjacent the bulk region but opposite the source region, the drain region including doped regions 504,514 of n and p dopant types; and a field plate 516 formed over the semiconductor body adjacent the drain region between the drain region and the bulk region.

19 Claims, 4 Drawing Sheets

HIGH BREAKDOWN-VOLTAGE TRANSISTOR WITH ELECTROSTATIC DISCHARGE PROTECTION

This application claims priority under 35, USC §119(e)(1) of provisional application number 60/057,217, filed Aug. 29, 1997.

FIELD OF THE INVENTION

This invention relates to semiconductor devices, and more specifically to high breakdown-voltage transistors that include a field-plated region.

BACKGROUND OF THE INVENTION

Output drive circuits for power applications require rugged high-breakdown voltage transistors that can withstand a harsh high-voltage, high-current environment. A common transistor for such applications is the lateral double-diffused metal-oxide-semiconductor transistor (LDMOS), which is, despite its name, typically has a gate composed of highly-doped polycrystalline silicon rather than metal. FIG. 1 shows a typical LDMOS transistor. In operation, the source and back gate are typically coupled to electrical ground and the drain is coupled to a positive voltage supply. In the transistor's active state, a channel is formed in the p-type region beneath the poly gate by applying a positive voltage to the gate.

An important feature of power semiconductor devices is the ability to withstand high breakdown voltages when the device is in the inactive or blocking state; that is, the condition in which the drain voltage is positive and the gate voltage is less than the threshold voltage required to form a channel in the p-type region. In this condition, the transistor shown in FIG. 1 forms a depletion region at the p-n junction 10. The depletion region withstands increasingly large positive drain voltages until the avalanche breakdown condition is reached. It is desirable that the transistor have as high a breakdown voltage as possible without sacrificing other device parameters such as on-resistance and the ability to withstand electrical transients.

SUMMARY OF THE INVENTION

The embodiments disclosed herein include an LDMOS transistor having an integral SCR. The depletion region from the drain/back gate junction of the LDMOS is redistributed using a thin-oxide field plate over the drain drift region adjacent the drain contact and held at the same electric potential as the drain contact. In accordance with a preferred embodiment of the invention, there is disclosed a transistor including a source region in a semiconductor body; a bulk region in the semiconductor body adjacent the source region; a drain region in the semiconductor body adjacent the bulk region but opposite the source region, the drain region including doped regions of n and p dopant types; and a field plate formed over the semiconductor body adjacent the drain region between the drain region and the bulk region.

An advantage of the inventive concepts is that the doping concentration in the drain drift region of the transistor can be set for excellent SCR performance in the event of a severe electrical transient, while the field plate allows the depletion region around the drain region to be adjusted to prevent punch-through from drain to source, thus providing a higher device breakdown voltage for a given feature spacing.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Protection of MOS Transistors During Electrical Transients

Figure 1:
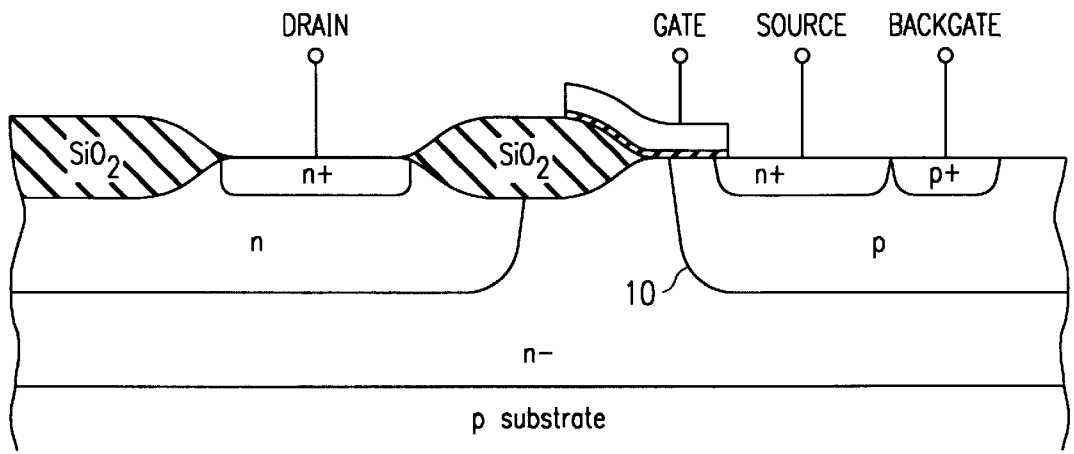
FIG. 1 is a cross-sectional view of a prior art LDMOS transistor.

LDMOS transistors inherently include parasitic bipolar transistors. These parasitics are typically detrimental to the performance of the MOS transistor because the bias conditions required to activate the parasitic transistor are within the normal operating range of the host device. Indeed, the back gate in the transistor shown in FIG. 1 is intended keep the n+-n-n--p-n+ parasitic between the drain and source terminals inactive in all operating modes of the MOS transistor. By connecting the source and back gate terminals, the p-type base and n+ emitter of the parasitic npn bipolar transistor are short-circuited.

Figure 3:
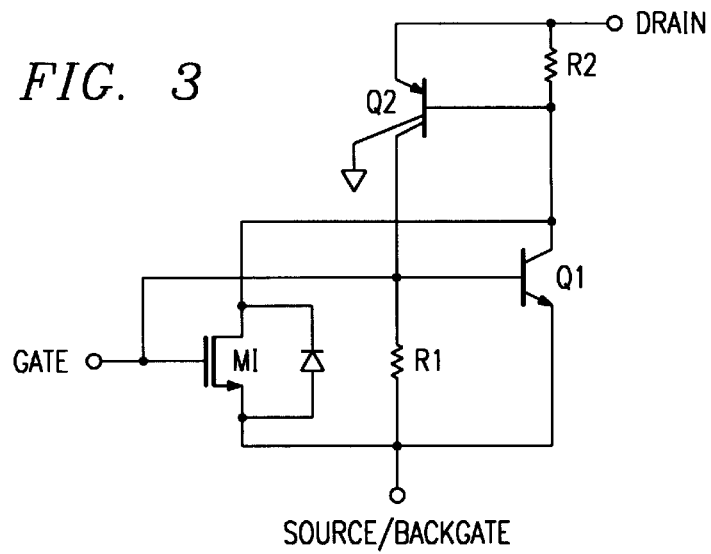
FIG. 3 is a schematic diagram of the structure of FIGS. 2 and FIGS. 5, 6, 7, and 8.
Figure 4:
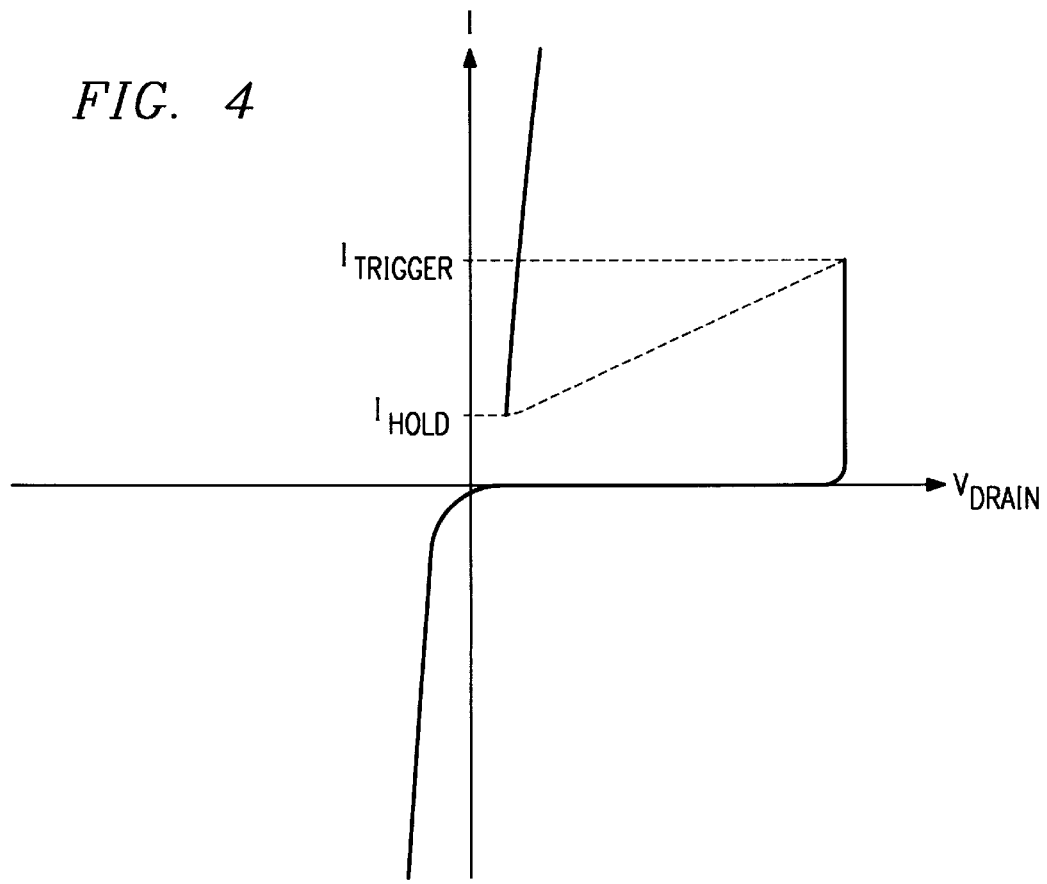
FIG. 4 is a current-voltage plot of an SCR.

The ready availability of such parasitic bipolars can be used advantageously to create transient protection circuitry for the host LDMOS transistor. The transistor shown in FIG. 2a, for example, includes p+ anodes 20 that can be used to form a semiconductor-controlled rectifier (SCR), the schematic diagram of which is superimposed upon the cross-section of the LDMOS transistor. The SCR is also shown in a separate schematic diagram in FIG. 3 for clarity. Referring to the current-voltage characteristics of an SCR in FIG. 4, as the drain-to-source voltage and current are increased, a trigger condition is eventually reached at which the SCR becomes active. For further increases in drain current, the voltage across the device is held relatively fixed by the SCR, while the current increases. It is important that the trigger-condition voltage and current are high enough to avoid interfering with the normal operation of the MOS host transistor. In addition, the holding current should be high so that after the SCR structure is triggered, a return to normal device operating conditions will deactivate the SCR. A low holding current would allow the SCR to remain active once triggered, necessitating a reset condition (cycling of drain power, for example) to deactivate the SCR and allow normal operation of the MOS device. The SCR in the structure shown in FIG. 2a triggers at about 10 mA and has a holding current of about 6 mA. These trigger conditions are too low for many applications.

Figure 2A:
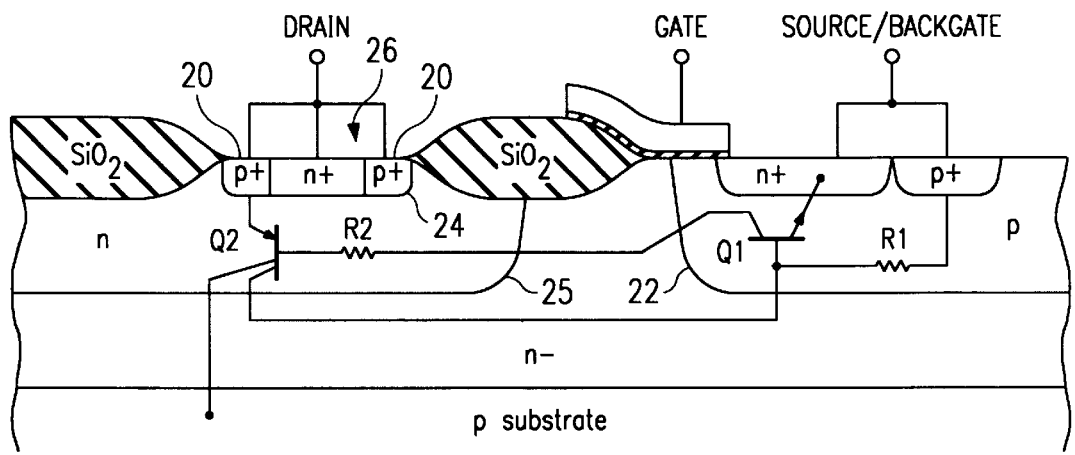
FIG. 2a is a cross-sectional view of a LDMOS-SCR structure with the schematic of the SCR superimposed.
Figure 2B:
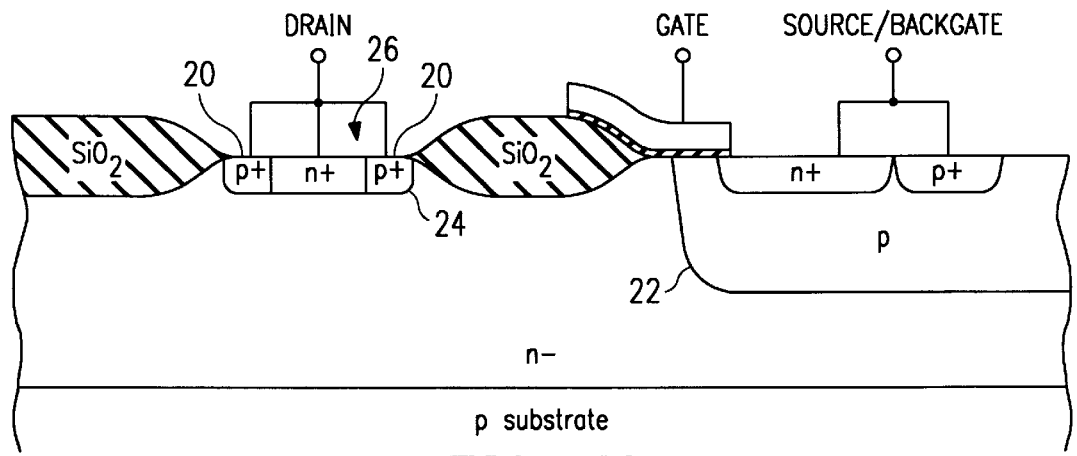
FIG. 2b is a cross-sectional view of an LDMOS-SCR structure without an n-tank under the drain.

The structure of FIG. 2b differs from that of FIG. 2a in that the n-type tank 25 in FIG. 2a is not present in the structure of FIG. 2b. This modification affects the breakdown voltage as discussed below, but it also affects the SCR performance. Because the SCR current is primarily within the bulk in the structure of FIG. 2a and not in proximity to the surface device (M1, the LDMOS transistor), the SCR cannot be reset using the gate electrode. In contrast, the structure of FIG. 2b retains gate control for reset purposes, but suffers from poor breakdown characteristics.

Breakdown Voltage in MOS Transistors

The breakdown voltage of the LDMOS transistor shown in FIG. 2a is the voltage at which the depletion region at the reverse-biased p-n junction 22 contacts the n-type drain tank 25. The entire electric field is thus concentrated at this point, resulting in avalanche breakdown. The structure shown in FIG. 2a breaks down at about 38 V. The breakdown voltage of the LDMOS transistor shown in FIG. 2b is the voltage at which the depletion region at the reverse-biased p-n junction 22 contacts a depletion region at the p+ anode 20. The structure shown in FIG. 2b suffers punch-through breakdown at about 25 V.

Another factor influencing the breakdown characteristics of the transistor is the design of the drift region between the drain and the gate. In general, the doping in the drift region in decreased and the length of the region is increased to provide a higher breakdown device. Each of these approaches presents problems, however. Decreasing the doping in the drift region can allow punch-through of the depletion region formed at junction 22 and the depletion region formed at junction 24, thus lowering the breakdown voltage of the device. Increasing the length of the drift region consumes more semiconductor die area, and is thus an undesirable option.

Embodiment Structures

Figure 5:
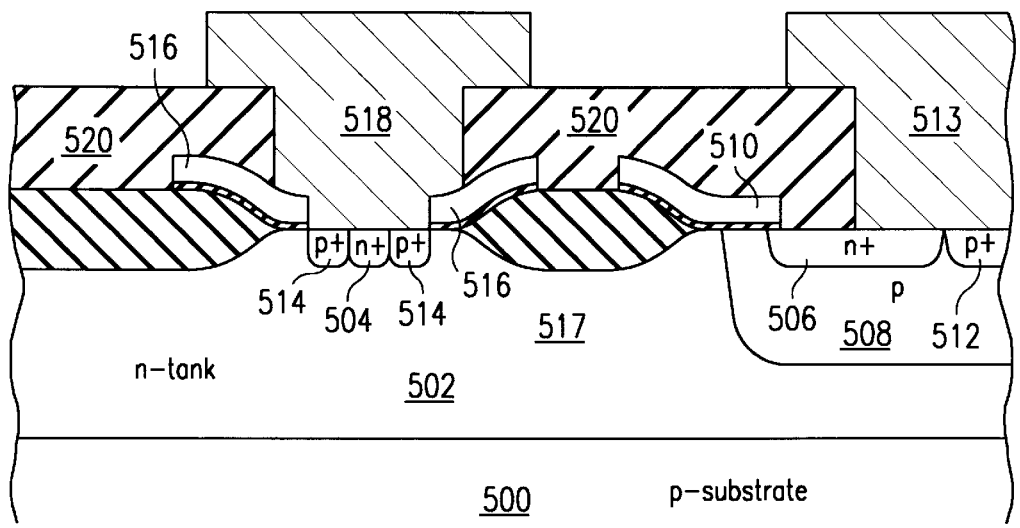
FIG. 5 is a cross-sectional view of a first preferred embodiment in accordance with the invention.

A first preferred embodiment in accordance with the invention is shown in FIG. 5. The structure is formed on a p-type substrate 500 and comprises an n-type well region 502. The LDMOS transistor includes an n+ drain 504, an n+ source 506, a p-type bulk region 508, a n+ polycrystalline silicon gate electrode 510 insulated from p bulk region 508 by a thin oxide layer, and a p+ back gate contact 512. The source 506 and back gate contact 512 are connected by source electrode 513. The contact to gate electrode 510 is not shown. Dielectric 520, SiO$_2$ for example, insulates electrodes 513 and 518 from gate electrode 510. The thin gate and field plate oxide typically ranges in thickness from 5 nm to 50 nm, and is preferably about 20 nm. Electrodes 513 and 518 may be formed with a PtSi$_2$ contact layer, a TiW barrier, and an Al—Cu alloy for example.

As in the structures shown in FIGS. 2a and 2b, the embodiment structure also includes p+ regions 514 adjacent the drain to allow for the formation of an SCR protection circuit within the structure. In contrast to the structure of FIG. 2a, however, the n-doped tank 25 beneath the drain has been removed in the structure of FIG. 5 to increase the breakdown voltage of the device. As mentioned above, the decrease in doping concentration resulting from the removal of the n-doped tank 25 typically results in increased probability of low-voltage punch-through from drain p+ region 514 to bulk region 508. Increasing the spacing between drain and source to help prevent punch-through is an undesirable option because it increases die size.

Applicants have discovered that the use of a polycrystalline silicon field plate 516 covering the portion of the drain drift region adjacent the p+ regions 514 provides a surprising increase in breakdown voltage to 65 Volts from 38 Volts. In addition, the SCR trigger current in the embodiment structure is 100 mA versus 10 mA for the structure shown in FIG. 2, and the holding current is greater than 20 mA as compared to 6 mA. Though its effects are not well understood, the field plate 516, which is held at the same potential as the drain 504 and p+ regions 514 through drain contact 518, is thought to redistribute the depletion region from bulk region 508 in the drain drift region 517. This redistribution is thought to lower the likelihood of punch-through to the depletion region formed at the junction between drift region 517 and p+ region 514. The breakdown voltage is thus determined by surface breakdown, which may be better controlled by applying bias to gate electrode 510.

This embodiment of the invention is advantageous in that the poly field plates 516 may be formed simultaneously with the gate electrode 510, thus necessitating no additional process steps. In addition, the poly field plate and poly gate also serve to mask the implantation of the p+ regions 514, the source region 506, and the bulk region 508 (prior to diffusion). Masking the drain, source, and bulk region with poly results in a predictable and constant drain-to-source spacing. In prior approaches in which the drain implants are masked with field oxide, process variations in field oxide masking and poly alignment result in unpredictable drain-to-source spacing variance.

The embodiments of the invention are also advantageous in that the use of the field plate has been shown to increase the breakdown voltage of the MOS device and the trigger and holding currents of the SCR as described above. At the same time, the drain-source resistance of the MOS device remained relatively constant at about 10 ohms, and the device has been demonstrated to withstand an ESD strike of at least 17 kV. In addition, the breakdown in the device is at the surface and hence can be controlled by the gate.

Figure 6:
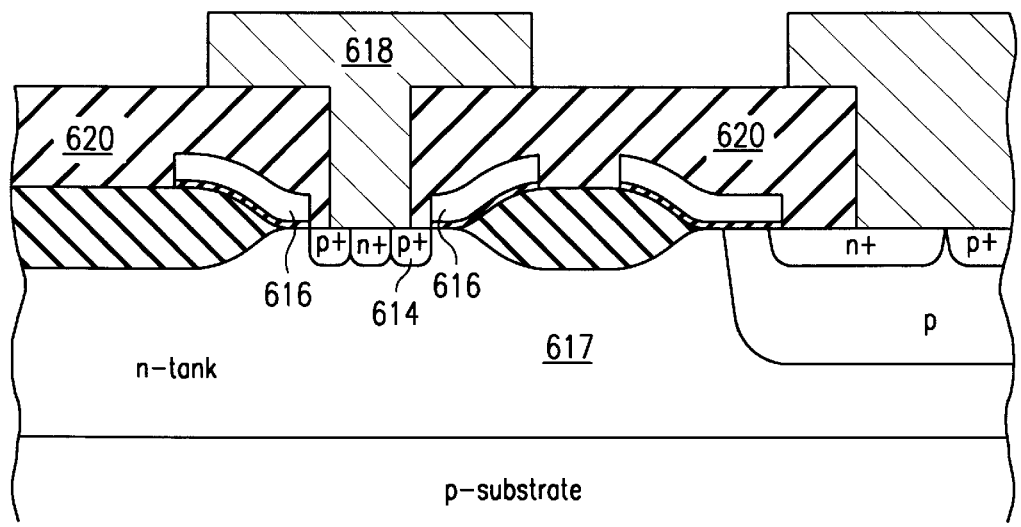
FIG. 6 is a cross-sectional view of a second preferred embodiment in accordance with the invention.

A second preferred embodiment in accordance with the invention is shown in FIG. 6. The structure is similar to that of FIG. 5, except that the drain electrode 618 does not contact the field plates 616. The electric potential on the field plates is achieved through capacitive coupling rather by direct contact as in the structure of FIG. 5. This configuration also facilitates the use of a bias voltage on the field plates 616 that is different from the bias applied to the drain electrode 618. The use of a separate bias voltage for the field plate allows a further degree of tailoring of the depletion region at the junction of regions 614 and 617 that may result in further improvement in breakdown voltage.

Figure 7:
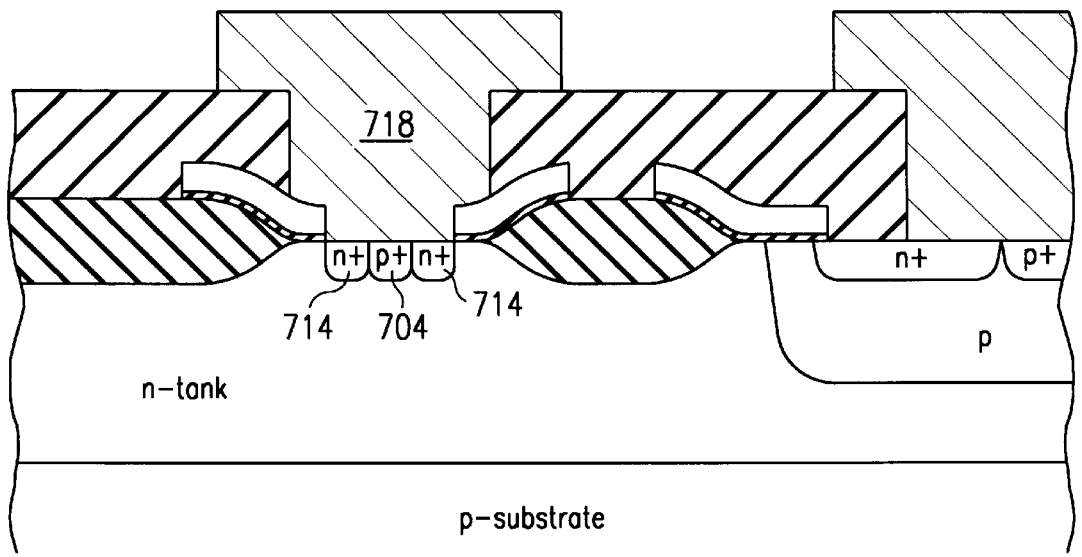
FIG. 7 is a cross-sectional view of a third preferred embodiment in accordance with the invention.

A third preferred embodiment in accordance with the invention is shown in FIG. 7. The structure is similar to that of FIG. 5, except that the p+ and n+ regions beneath the drain electrode are reversed versus those shown in FIG. 5. This decreases the R2 component of the SCR shown schematically in FIGS. 2a and 3 because current from drain to source does not pass around region 704 in the same magnitude that it does in FIGS. 5 and 6. Thus, a higher drain current is required to turn on the pnp device (an effect equivalent to decreasing R2). Decreasing the R2 component increases the trigger and hold currents, thus allowing even higher normal current loads to be used without latching the SCR structure in its active state.

Figure 8:
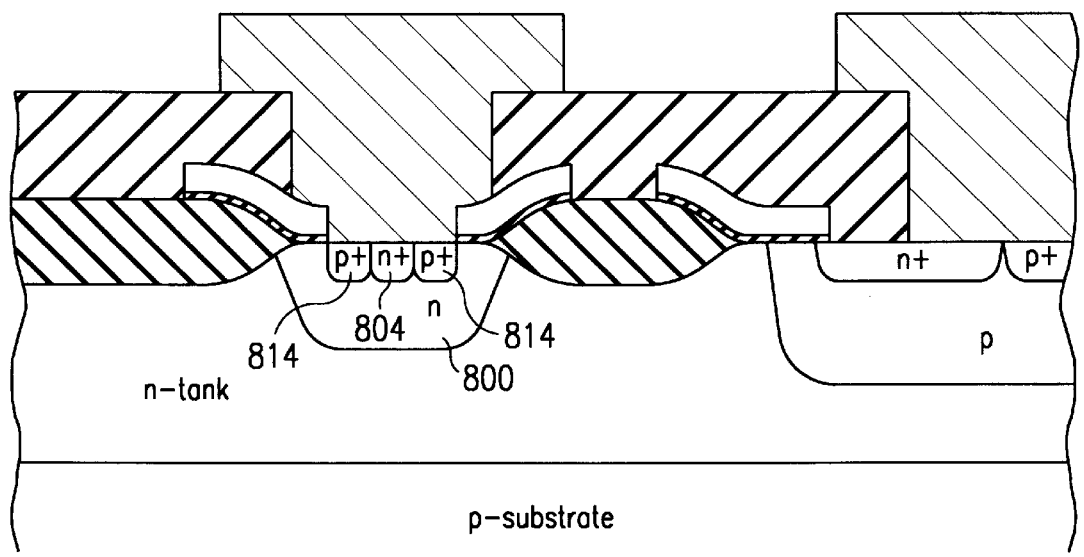
FIG. 8 is a cross-sectional view of a fourth preferred embodiment in accordance with the invention.

A fourth preferred embodiment in accordance with the invention is shown in FIG. 8. The structure is similar to that of FIG. 5, except for the addition of an n-type region 800 beneath the n+ and p+ drain regions 804, 814. This region reduces the pnp gain of the parasitic bipolar transistor Q2 shown schematically in FIGS. 2 and 3. Reducing the gain of Q2 also increases the trigger and hold currents of the SCR. The skilled artisan will appreciate that aspects of these embodiments may be used individually or in combination to produce the desired breakdown and SCR characteristics.

In other embodiments, the n+ and p+ drain regions 804 and 814 of the structure in FIG. 8 may be reversed as shown in the structure of FIG. 7. Also, the capacitively coupled drain electrode illustrated in FIG. 6 can be applied to the structures shown in FIGS. 7 and 8.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, though the embodiments describe an n-channel MOSFET, it will be appreciated that the p-channel configuration is within the scope of the invention as well. In addition, shallow trench isolation may be used rather than the field oxide shown in the embodiments. Gate and field plate materials other than polycrystalline silicon, metal for example, may also be used. Reduced surface field (RESURF) techniques may be used to distribute dopants within the structure rather than the ion implantation followed by diffusion described hereinabove. Aspects of the invention may benefit vertical DMOS devices and other types of power devices as well as the LDMOS embodiments shown. It is therefore intended that the appended claims encompass any such modifications or embodiments. Note also that the dopant concentration designations n−, p−, n, p, n+, and p+ are intended to denote relative concentrations, with n and p representing a higher doping concentration than n− and p−, and n+ and p+ representing a higher doping concentration than n and p. The actual dopant concentration denoted by each symbol varies with semiconductor material and dopant.

What is claimed is:

1. A transistor, comprising:
    (a) a source region in a semiconductor body;
    (b) a bulk region in said semiconductor body adjacent said source region;
    (c) a drain region in said semiconductor body adjacent said bulk region but opposite said source region, said drain region comprising doped regions of n and p dopant types;
    (d) a field plate over and insulated from said semiconductor body adjacent said drain region between said drain region and said bulk region; and
    (e) a gate over and insulated from said semiconductor body adjacent said bulk between said drain region and said source region, wherein said field plate and said gate are formed from a common layer.

2. The transistor of claim 1, wherein said drain region is separated from said bulk region in said semiconductor body by a drain drift region.

3. The transistor of claim 2, wherein said drain drift region is doped n-type.

4. The transistor of claim 1, further comprising a drain electrode contacting said drain region and said field plate.

5. The transistor of claim 1, further comprising a drain electrode contacting said drain region, but insulated from said field plate, said field plate being capacitively coupled to said drain electrode.

6. The transistor of claim 1, wherein said source region is doped n+, said bulk region is doped p-type, and said doped regions of said drain region are n+ and p+.

7. The transistor of claim 1, wherein said drain region comprises a central n+ doped region bounded by p+ doped regions.

8. The transistor of claim 1, wherein said drain region comprises a central p+ doped region bounded by n+ doped regions.

9. A lateral double-diffused MOS transistor, comprising:
    (a) a tank region formed in a substrate;
    (b) a bulk region formed in said tank region, a portion of said bulk region extending to a surface of said tank region;
    (c) a source region formed in said bulk region;
    (d) a source electrode coupled to said source region and said bulk region;
    (e) a gate electrode over and insulated from said portion of said bulk region extending to a surface of said tank region;
    (f) a drain region comprising n and p doped regions, said drain region separated from said bulk region by a drain drift region in said tank region;
    (g) a field plate over and insulated from said drain drift region and adjacent said drain region, said field plate and said gate formed from a common layer; and
    (h) a drain electrode coupled to said drain region and said field plate.

10. The transistor of claim 9, wherein said drain electrode is in electrical contact with said field plate.

11. The transistor of claim 9, wherein said drain region comprises a central n+ doped region bounded by p+ doped regions.

12. The transistor of claim 9, wherein said drain region comprises a central p+ doped region bounded by n+ doped regions.

13. The transistor of claim 9, wherein said drain region is formed within a n-type region within said drain drift region, said n-type region having a higher dopant concentration than said drain drift region.

14. A lateral double-diffused MOS transistor with an integral SCR, comprising:
    (a) a tank region doped with a first dopant species and formed in a substrate doped with a second dopant species, said second species a dopant type opposite the first type;
    (b) a bulk region doped with said second dopant species and formed in said tank region, a portion of said bulk region extending to a surface of said tank region;
    (c) a source region doped with said first dopant species and formed in said bulk region;
    (d) a back gate region contact doped with said second dopant species and formed in said bulk region;
    (e) a source electrode coupled to said source region and said back gate region;
    (f) a gate electrode over and insulated from said portion of said bulk region extending to a surface of said tank region;

(g) a drain region comprising a region doped with said first dopant species and a region doped with said second dopant species, said drain region separated from said bulk region by a drain drift region in said tank region;

(h) a field plate over and insulated from said drain drift region and adjacent said drain region, said field plate and said gate formed from a common layer; and (i) a drain electrode coupled to said drain region and said field plate.

15. The transistor of claim 14, wherein said first dopant species is n-type and said second dopant species is p-type.

16. The transistor of claim 14, wherein said drain electrode is in electrical contact with said field plate.

17. The transistor of claim 14, wherein said drain region comprises a central n+ doped region bounded by p+ doped regions.

18. The transistor of claim 14, wherein said drain region comprises a central p+ doped region bounded by n+ doped regions.

19. The transistor of claim 14, wherein said drain region is formed within a region doped with said first dopant species and within said drain drift region, said region doped with said first dopant species having a higher dopant concentration than said drain drift region.

* * * * *